(12) United States Patent
Gresset et al.

(10) Patent No.: US 10,855,311 B2
(45) Date of Patent: Dec. 1, 2020

(54) METHOD AND DEVICE FOR DETERMINING FEATURES OF ERROR CORRECTING CODE SYSTEM

(71) Applicant: MITSUBISHI ELECTRIC CORPORATION, Tokyo (JP)

(72) Inventors: Nicolas Gresset, Rennes (FR); Victor Exposito, Rennes (FR)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 155 days.

(21) Appl. No.: 15/752,969

(22) PCT Filed: Sep. 16, 2016

(86) PCT No.: PCT/JP2016/078135
§ 371 (c)(1),
(2) Date: Feb. 15, 2018

(87) PCT Pub. No.: WO2017/057206
PCT Pub. Date: Apr. 6, 2017

(65) Prior Publication Data
US 2018/0241414 A1    Aug. 23, 2018

(30) Foreign Application Priority Data

Oct. 2, 2015    (EP) .................................... 15188166

(51) Int. Cl.
*H04L 1/00*    (2006.01)
*H03M 13/11*    (2006.01)
(Continued)

(52) U.S. Cl.
CPC ...... *H03M 13/1111* (2013.01); *H03M 13/033* (2013.01); *H03M 13/1102* (2013.01);
(Continued)

(58) Field of Classification Search
CPC ............ H03M 13/1111; H03M 13/033; H03M 13/1102; H03M 13/2957; H03M 13/13; H04L 1/0042
(Continued)

(56) References Cited

U.S. PATENT DOCUMENTS 6,161,209 A * 12/2000 Moher .............. H03M 13/2957
375/262
8,621,307 B2 * 12/2013 Cai ....................... H04L 1/0045
370/335

(Continued)

FOREIGN PATENT DOCUMENTS

WO    WO 2014/092502 A1    6/2014

OTHER PUBLICATIONS

Si et al. "Polar Coding for Fading Channels: Binary and Exponential Channel Cases", IEEE Transactions on Communications, vol. 62, No. 8, Aug. 2014, pp. 2638-2650.
(Continued)

*Primary Examiner* — Albert Decady
*Assistant Examiner* — Enam Ahmed
(74) *Attorney, Agent, or Firm* — Birch, Stewart, Kolasch & Birch, LLP

(57) ABSTRACT

A method for determining features of an error correcting code system, comprising independent error correcting codes and a polarization module, allowing transmitting a binary input vector on block fading sub-channels, the independent error correcting codes generating components of the binary input vector and a channel polarization being applied to the binary input vector by the polarization module. The method comprises: obtaining characteristics of the block fading sub-channels; and, determining features of said error correcting code system, comprising, for each error correcting code, a rate of said error correcting code, adapted to the
(Continued)

obtained characteristics and minimizing a function of a probability that an instantaneous equivalent channel capacity of the block fading sub-channels is below a transmission rate transmitted on the block fading sub-channels.

14 Claims, 5 Drawing Sheets

(51) Int. Cl.
    *H03M 13/13*     (2006.01)
    *H03M 13/03*     (2006.01)
    *H03M 13/29*     (2006.01)

(52) U.S. Cl.
    CPC ....... *H03M 13/13* (2013.01); *H03M 13/2957* (2013.01); *H04L 1/0042* (2013.01)

(58) Field of Classification Search
    USPC .......................................................... 714/746
    See application file for complete search history.

(56) References Cited

U.S. PATENT DOCUMENTS

| | | | | |
|---|---|---|---|---|
| 8,634,450 | B2* | 1/2014 | Vidal | H03M 13/251 |
| | | | | 375/222 |
| 2003/0095529 | A1* | 5/2003 | Petre | H04B 1/7105 |
| | | | | 370/342 |
| 2007/0033476 | A1* | 2/2007 | Osnato | H04L 1/005 |
| | | | | 714/746 |
| 2009/0024906 | A1* | 1/2009 | Calderbank | H04L 1/0618 |
| | | | | 714/782 |
| 2009/0307542 | A1* | 12/2009 | Roohparvar | G11C 29/04 |
| | | | | 714/704 |
| 2013/0272444 | A1* | 10/2013 | Barron | H03M 13/3746 |
| | | | | 375/295 |
| 2016/0380763 | A1* | 12/2016 | Ahn | H04L 9/0875 |
| | | | | 380/270 |

OTHER PUBLICATIONS

Office Action dated Jul. 7, 2020 in corresponding Indian Application No. 201847008941.

* cited by examiner

METHOD AND DEVICE FOR DETERMINING FEATURES OF ERROR CORRECTING CODE SYSTEM

TECHNICAL FIELD

The invention concerns a method for determining features of an error correcting code system, and a device implementing the method.

BACKGROUND ART

Even though data storage technologies and communication technologies are improving, the quantity of data to store or to communicate is increasing in parallel. As a consequence, research for high data rate communication and storage technologies are still active. Millimeter wave technologies is one research focus in the field of high data rate communications.

Millimeter wave communication technology uses frequencies going from "30" to "300" GHz with wavelengths from "10" to "1" mm. Millimeter wave communication technology allows attaining data rates up to few tens of Gbits/s. However, while signals using lower frequency bands, such as GSM (Global System for Mobile Communications), can propagate on a high distance and easily penetrate buildings, a signal based on millimeter wave communication technologies can only travel on few kilometers, and suffers from high transmission losses in the air and solid materials. There is therefore a need for solutions allowing improving millimeter wave based communications in terms of reliability.

A known communication system comprises a modem involving multiple sub-band OFDM (Orthogonal Frequency-Division Multiplexing) signals transmitted using a millimeter wave communication technology. As a result, in each sub-band, a different fading is experienced. When the transmitter does not know the fading coefficients because of a too high mobility of the transmitter or receiver, or because the transmission is performed in a broadcast approach, or because no feedback exists of the estimated coefficients by the receiver to the transmitter, this leads to a so-called block-fading (BF) channel. In order to deal with transmission errors, the communication system implements an error correction module. One possibility to implement an error correction module is to use a single error correcting code in the communication system. However, designing a single error correcting code adapted to BF channels in the context of millimeter wave based communications is complex. For instance a design of a turbo-code or a LDPC (Low Density Parity Check) code depends on characteristics of the BF channel (such as the SNR (Signal to Noise Ratio) on the channel, fading characteristics, . . . ) which are generally variable.

One solution to deal with this design issue consists in dividing the single error correcting code into independent parallel error correcting codes generating independently coded sub-blocks. Such parallelization of error correcting codes is adapted to the known system involving multiple sub-band OFDM signals. However, using independent parallel error correcting codes on BF channels induces a loss in terms of use of an equivalent channel capacity corresponding to a combination of BF channels capacities. There is a need to design an error correcting code system allowing meeting (or at least approaching) the equivalent channel capacity. Furthermore, the millimeter wave communication technology gives access to larger bandwidths, which also implies larger codewords of the error correcting code and increased complexity or latency issues at the transmitters and receivers.

Polar codes as defined in the paper "*channel polarization: a method for constructing capacity-achieving codes for symmetric binary-input memoryless channels, Erdal Arikan, IEEE Tr. Inform. Theory, Vol.* 55, No. 7, PP. 3051-3073, July 2009" are error correcting codes allowing meeting asymptotically a channel capacity, facilitating parallelization and having low encoding and decoding complexity, even for larger codeword sizes.

Polar codes use a principle of channel polarization. Channel polarization, as defined by Arikan in the above paper, is an operation by which, from a number N (N≥2) of copies of a given BDMC (Binary Discrete Memoryless Channel) channel W, one generates a vector of N sub-channels $W_N^i$ (i being an integer comprised in [1; N]) that show a polarization effect in the sense that, as the number N becomes infinite, it can be shown that a conditional mutual information of the sub-channels $W_N^i$, knowing the input of the $W_N^1$ to $W_N^{i-1}$ channels, is either "0" or "1", i.e., respectively the sub-channels are null or perfect. Asymptotically, when the size of the error correcting code increases to infinity, the proportion of perfect sub-channels is equal to the capacity of the initial BDMC channel. For the polarization of the channel to work, it is necessary to know the data transmitted on the null sub-channel(s), which is impossible except if it is known in advance. Thus, the design of a polar code lies in identification of the inputs that will be converted into null sub-channels, and the transmission of so-called frozen bits at these inputs. Under this condition, the polar codes are known to be capacity achieving. However, the null sub-channels positions change with the characteristic of the initial BDMC channel (e.g., change with the SNR), which is one main difficulty for the design of polar codes. In practice, finite length polar codes achieve good performance above $2^{12}$ bits, and current research in the field tends to provide good performance even for smaller code sizes.

FIG. 1A illustrates a principle of polar codes in the case of BDMC channels. In FIG. 1A a binary input vector of size "2" U=[U1, U2] is transformed by a kernel (called polarization kernel in the following) into a binary polarized vector of size "2" X=[X1,X2]. In FIG. 1A, the polarization kernel is a polarization kernel $K_2$ of size "2". A polarization kernel can be represented by a square matrix (or polarization matrix) of size N. In the example of FIG. 1A, the polarization matrix representing the kernel $K_2$ is as follows:

$$K_2 = \begin{bmatrix} 1 & 0 \\ 1 & 1 \end{bmatrix}$$

and $$X = U \cdot K_2$$

Each component of the binary polarized vector X is transmitted on a different copy of a BDMC channel, i.e., a different sub-channel. The output of the two sub-channels (i.e., the output of the equivalent channel) is an output vector of size "2" Y=[Y1, Y2]. As seen above, the polarization does not change the capacity of the equivalent channel with respect to the initial BDMC channel. As a consequence, in the example of FIG. 1A, it can be shown that $$I(U;Y)=I(X;Y)$$

where I(x,y) denotes a mutual information between a random variable x and a random variable y.

SUMMARY OF INVENTION

Technical Problem

However, whereas I(X1; Y1)=I(X2; Y2) since the two sub-channels have the same characteristics, it can be shown that:

$$I(U;Y)=I(U1;Y1,Y2)+I(U2;Y1,Y2|U1)$$

where I(x,y|z) denotes the mutual information between the random variables x and y knowing a random variable z. The effect of the polarization (polarization effect) on the mutual information is the following:

$$I(U1; Y1, Y2) \le \frac{I(X; Y)}{2} \le I(U2; Y1, Y2 \mid U1)$$

which leads to an equivalent channel with binary input vector U and output vector Y which has the following properties:
- the component U1 is sent on a sub-channel with lower capacity than the initial BDMC channel, since it is interfered by the component U2;
- if the component U1 is assumed known (for example if it has been previously decoded correctly), then U2 is transmitted on a sub-channel with higher capacity than the initial BDMC channel.

As can be seen from the above, the polarization effect is obtained asymptotically when N is infinite. This effect can be approached by increasing the size of the polarization kernel. One solution to increase the size of the polarization kernel consists in concatenating and multiplexing in a recursive fashion the inputs and outputs of the kernel $K_2$. FIG. 1B represents a concatenation and a multiplexing of the kernel $K_2$ allowing obtaining a kernel $K_8$ of size N=8. However, other kernels can be used instead of the kernel $K_2$ (or the kernels obtained by concatenation and multiplexing of the kernel $K_2$), and in particular kernels having odd sizes.

An additional property of the channel polarization is to create dependencies between channels which introduces diversity in the error correcting code system.

However, as can be seen from the above, the theory of channel polarization was defined in the context of BDMC channels. Few investigations had been conducted on channel polarization in the particular context of BF channels.

It is desirable to overcome the above drawbacks. It is particularly desirable to design an error correcting code system having a design sufficiently flexible to adapt to BF channels having varying characteristics (SNR, Fading). In addition, said error correcting code system should facilitate parallelization to manage any size of binary input vectors. Furthermore, this error correcting code system should limit the loss in terms of use of the equivalent channel capacity.

It is particularly desirable to design a method based on channel polarization adapted to BF channels.

According to a first aspect of the invention, the invention concerns a method for determining features of an error correcting code system, comprising independent error correcting codes and a polarization module, allowing transmitting a binary input vector on block fading sub-channels, called BF sub-channels, each BF sub-channel being affected by an Additive White Gaussian Noise with a signal to noise ratio represented by a first random variable, function of a second random variable, independent on each BF sub-channel, representative of a fading on said BF sub-channel, and a parameter, identical on each BF sub-channel, representative of a long term signal to noise ratio on said BF sub-channel, the independent error correcting codes generating at least one component of the binary input vector and a channel polarization being applied to the binary input vector by the polarization module, to obtain a binary polarized vector. The method comprises: obtaining a tuple of data comprising a value of the parameter and a set, called probability distribution set, comprising, for each BF sub-channel, data representative of a probability distribution of the second random variable corresponding to said sub-channel; and, determining features of said error correcting code system, comprising, for each error correcting code (200, 201, 202), a rate, called design rate, of said error correcting code (200, 201, 202), adapted to the obtained tuple of data and minimizing a function of a probability, called outage probability, that an instantaneous equivalent channel capacity of the BF sub-channels is below a transmission rate transmitted on the BF sub-channels, said transmission rate being the sum of the design rates, said outage probability being approximated, assuming that each component of the binary input vector is transmitted on a BF sub-channel, called polarized BF sub-channel, of an equivalent channel created by the polarization module, by a probability, called approximated outage probability, that an instantaneous channel capacity of at least one polarized BF sub-channel is below the design rate of the error correcting code providing the component of the binary input vector intended to be transmitted on said polarized BF sub-channel.

The method allows designing an error correcting code system comprising a plurality of parallel error correcting codes adapted to a transmission of data on BF sub-channels. The method is highly flexible since it allows determining features of an error correcting code system comprising any number of error correcting codes and any size of polarization kernel. Furthermore, the method allows limiting the loss in terms of use of the equivalent channel capacity.

In an embodiment, the polarization module is adapted to implement any polarization kernel of a predefined set of polarization kernels, and wherein, one feature of the error correcting code system determined is a polarization kernel selected in the predefined set of polarization kernels.

Allowing using a plurality of polarization kernels allows better adapting the error correcting code system to the BF sub-channels characteristics (SNR, Fading).

In an embodiment, each polarization kernel of the predefined set of polarization kernels is a square matrix made of coefficients equal to "0" or "1", said matrix being of full rank and comprises at least one row comprising two coefficients equal to "1".

In an embodiment, when determining the features of said error correcting code system adapted to the obtained tuple of data and minimizing the function of the outage probability, a plurality of transmission rates is tested, the transmission rate maximizing a function of the outage probability representative of the throughput of the error correcting code system being selected.

The transmission rate of the error correcting code system becomes a feature of the error correcting code system to be optimized, which allows improving the system throughput when the long term SNR is known at the transmitter, and an automatic repeat request retransmission technique is used.

In an embodiment, the instantaneous channel capacity of a polarized BF sub-channel is computed as a mutual information between the component, called current component, intended to be transmitted on said polarized sub-channel and an output vector resulting from the transmission of the binary polarized vector on the BF sub-channels, knowing each component of the binary input vector with which the current component interferes after channel polarization by the polarization module and a set of first random variables comprising the first random variables of each BF sub-channel; and, the features minimizing the outage probability are determined using a statistical method comprising: evaluating an instantaneous channel capacity for each polarized BF sub-channel, for each set of first random variables of a plurality of possible sets of first random variables and for each polarization kernel of the predefined set of polarization kernels; and, for each value of the parameter comprised in a pre-defined set of values of the parameter, for each probability distribution set of a pre-defined plurality of probability distribution sets and for each transmission rate of a pre-defined set of transmission rates using the evaluated instantaneous channel capacities to determine the features of said error correcting code system minimizing the approximated outage probability for said value of the parameter, said probability distribution set and said transmission rate.

Using the approximated outage probability allows facilitating the determination of the error correcting code system characteristics.

In an embodiment, the instantaneous channel capacity of each polarized BF sub-channel is evaluated for one set of first random variables of the plurality of possible sets of first random variables and one polarization kernel of the pre-defined set of polarization kernels by using a process based on a Monte-Carlo simulation and a belief propagation decoding on said one polarization kernel with a genie-aided method that assumes perfect a priori input for the components of the binary input vector with which the component intended to be transmitted on said sub-channel interferes after channel polarization by the polarization module, said process comprising for each polarized BF sub-channel: iteratively generating a random Log Likelihood Ratio L following a Gaussian distribution and performing a belief propagation decoding of said random Log Likelihood Ratio L on said polarization kernel and computing a value representative of an estimation $J'$ of the instantaneous channel capacity of said polarized BF sub-channel using a result $L'$ of the belief propagation decoding of the random Log Likelihood Ratio L as follows:

$$J'=1-\log_2(1+\exp(-L'));$$

and, evaluating the instantaneous channel capacity of said polarized BF sub-channel as an average of the estimations $J'$ of the instantaneous channel capacity of said polarized BF sub-channel.

Thus, the outage probability estimation is accurate.

In an embodiment, when determining the features of said error correcting code system minimizing the approximated outage probability for each value of the parameter comprised in the pre-defined set of values of the parameter, for each probability distribution set of the pre-defined plurality of probability distribution sets and for each transmission rate of the pre-defined set of transmission rates, an approximated outage probability is computed for each polarization kernel of the predefined set of polarization kernels and for each set of design rates of a plurality of sets of design rates, each set of design rates of said plurality of sets of design rates comprising a design rate for each error correcting code.

Thus, the design rates allow for providing the best performance for a given long term SNR and a given probability distribution set.

In an embodiment, each approximated outage probability is obtained for a value of the parameter, for a probability distribution set and for a design rate by a numerical integration of a product of probability density functions of the first random variables on a region such that the instantaneous channel capacity of at least one polarized BF sub-channel is below the design rate of the error correcting code providing the component of the binary input vector intended to be transmitted on said polarized BF sub-channel, the probability density functions of the first random variable being determined using said value of the parameter and said probability distribution set.

Thus, the design rates are accurate and easily evaluated.

In an embodiment, the approximated outage probability is obtained by a Monte-Carlo simulation that generates random realizations of the first random variables and accumulates an error event if the instantaneous channel capacity of at least one polarized BF sub-channel is below the design rate of the error correcting code providing the component of the binary input vector intended to be transmitted on said polarized BF sub-channel.

Thus, the design rates are accurate and evaluated with a low complexity algorithm.

In an embodiment, the statistical method is implemented offline and allows obtaining a table, called correspondence table, comprising, for each value of the parameter comprised in the pre-defined set of values of the parameter and for each probability distribution set of the pre-defined plurality of probability distribution sets, the features of the error correcting code system adapted to said value of the parameter and said probability distribution set and minimizing the outage probability, the features of the error correcting code system adapted to the obtained tuple of data and minimizing the outage probability being determined by using said correspondence table.

The use of the correspondence table allows reducing the complexity of the method for determining the features of the error correcting codes system during a transmission of data.

According to a second aspect of the invention, the invention concerns a device for determining features of an error correcting code system, comprising independent error correcting codes and a polarization module, allowing transmitting a binary input vector on block fading sub-channels, called BF sub-channels, each BF sub-channel being affected by an Additive White Gaussian Noise with a signal to noise ratio represented by a first random variable, function of a second random variable, independent on each BF sub-channel, representative of a fading on said BF sub-channel, and a parameter, identical on each BF sub-channel, representative of a long term signal to noise ratio on said BF sub-channel, the independent error correcting codes generating at least one component of the binary input vector and a channel polarization being applied to the binary input vector by the polarization module, to obtain a binary polarized vector. The device comprises: obtaining means for obtaining a tuple of data comprising a value of the parameter and a set, called probability distribution set, comprising, for each BF sub-channel, data representative of a probability distribution of the second random variable corresponding to said BF sub-channel; and, determination means for determining features of said error correcting code system, comprising, for each error correcting code, a rate, called design rate, of said error correcting code, adapted to the obtained tuple of data and minimizing a probability, called outage probability, that an instantaneous equivalent channel capacity of the BF sub-channels is below a transmission rate transmitted on the BF sub-channels, said transmission rate being the sum of the design rates, said outage probability being approximated, assuming that each component of the binary input vector is transmitted on a BF sub-channel, called polarized BF sub-channel, of an equivalent channel created by the polarization module, by a probability, called approximated outage probability, that an instantaneous channel capacity of at least one polarized BF sub-channel is below the design rate of the error correcting code providing the component of the binary input vector intended to be transmitted on said polarized BF sub-channel.

Thus, the performance of the system are easily modeled, which allows an accurate selection of the design rates, and the system performance is improved by the help of the polarization kernel and design rates optimization.

According to a third aspect of the invention, the invention concerns a method for transmitting each component of a binary input vector on a different block fading sub-channel, called BF sub-channel, of a plurality of BF sub-channels, each BF sub-channel of said plurality being affected by an Additive White Gaussian Noise with a signal to noise ratio represented by a first random variable, function of a second random variable, independent on each BF sub-channel, representative of a fading on said BF sub-channel, and a parameter, identical on each BF sub-channel, representative of a long term signal to noise ratio on said BF sub-channel, independent error correcting codes generating at least one component of the binary input vector and a channel polarization being applied to the binary input vector by a polarization module to obtain a binary polarized vector, the independent error correcting codes and the polarization module being comprised in an error correcting code system. The method comprises: applying the method according to the first aspect for determining features of the error correcting code system; generating the binary polarized vector using the features of the error correcting code system determined; and, providing said binary polarized vector to a modulation module insuring a modulation of said binary polarized vector before its transmission.

According to a fourth aspect of the invention, the invention concerns transmission system comprising an error correcting code system allowing transmitting a binary input vector on block fading sub-channels, called BF sub-channels, each BF sub-channel being affected by an Additive White Gaussian Noise with a signal to noise ratio represented by a first random variable, function of a second random variable, independent on each BF sub-channel, representative of a fading on said BF sub-channel, and a parameter, identical on each BF sub-channel, representative of a long term signal to noise ratio on said BF sub-channel, the error correcting code system comprising independent error correcting codes, each adapted to generate at least one component of the binary input vector, and a polarization module, adapted to apply a channel polarization to the binary input vector to obtain a binary polarized vector, the transmission system comprising a device according to the second aspect.

According to a fifth aspect of the invention, the invention concerns a receiver system comprising an inverse error correcting code system adapted to decode an output vector resulting from a transmission, by a transmission system, of a binary polarized vector on block fading sub-channels, called BF sub-channels, each BF sub-channel being affected by an Additive White Gaussian Noise with a signal to noise ratio represented by a first random variable function of a second random variable, independent on each BF sub-channel, representative of a fading on said BF sub-channel, and a parameter, identical on each BF sub-channel, representative of a long term signal to noise ratio on said BF sub-channel, the binary polarized vector having been generated by an error correcting code system comprised in the transmission system comprising independent error correcting codes each adapted to generate at least one component of a binary input vector and, a polarization module adapted to apply a channel polarization to the binary input vector to obtain the binary polarized vector, the receiver system comprising a device according to the second aspect allowing determining features of the error correcting code system and means for transmitting the determined features to the transmission system.

According to a sixth aspect of the invention, the invention concerns a computer program comprising program code instructions which can be loaded in a programmable device for implementing the method according to the first aspect, when the program code instructions are run by the programmable device.

According to a seventh aspect of the invention, the invention concerns information storage means storing a computer program comprising program code instructions which can be loaded in a programmable device for implementing the method according to the first aspect, when the program code instructions are run by the programmable device.

The characteristics of the present invention mentioned above, as well as other characteristics will appear more clearly on reading the following description of an example of an embodiment, said description being done in relation with the joint drawings.

DESCRIPTION OF EMBODIMENTS

Figure 1A:
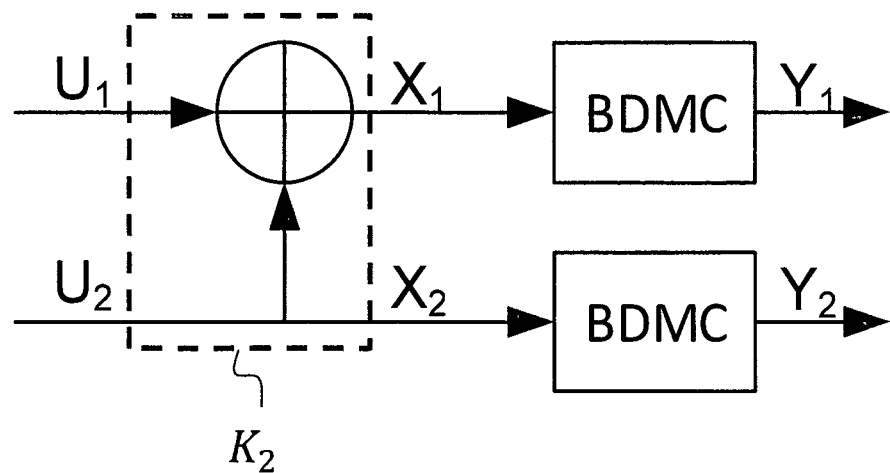
FIG. 1A illustrates schematically a principle of polar codes in the case of Binary Discrete Memoryless Channels.
Figure 1B:
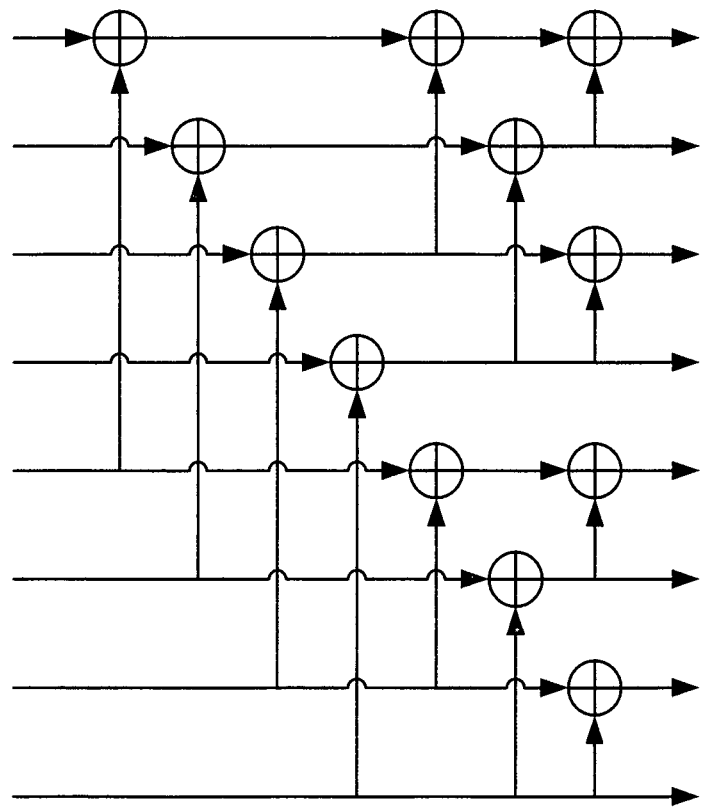
FIG. 1B illustrates schematically a concatenation and a multiplexing of a polarization kernel of size two allowing obtaining a polarization kernel of size height.
Figure 2A:
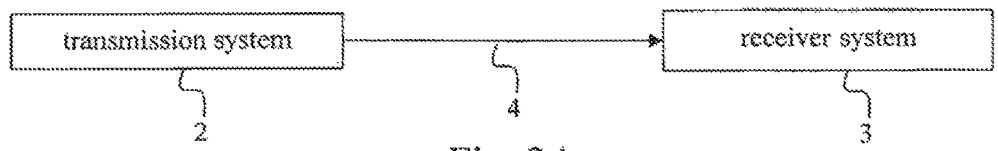
FIG. 2A illustrates schematically an example of a communication system in which the invention can be implemented.

FIG. 2A illustrates schematically an example of a communication system in which the invention can be implemented.

The communication system 1 comprises a transmission system 2 and a receiver system 3 communicating using a wireless channel 4 based on a millimeter wave technology using, for instance, the "60" GHz radio band. Bitrates allowed by the system 1 are, for example, of the order of few GBits/s.

Figure 2B:
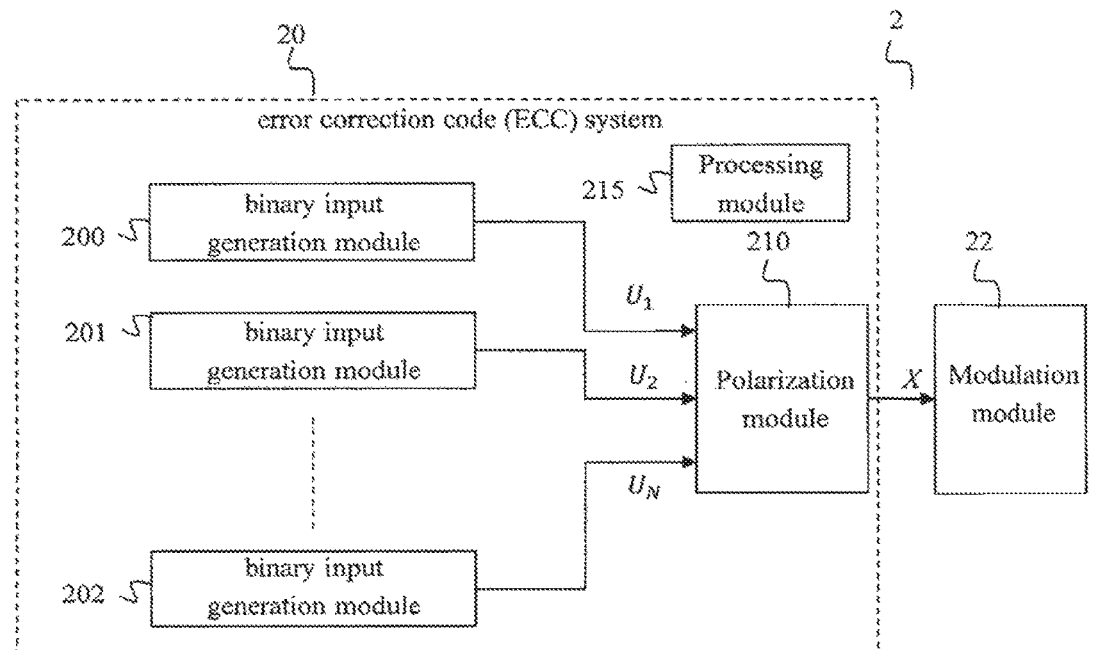
FIG. 2B illustrates schematically an example of transmission system adapted to implement the invention.

FIG. 2B illustrates schematically an example of transmission system adapted to implement the invention.

The transmission system 2 comprises an error correction code (ECC) system 20 and a modulation module 22. The ECC system 20 comprises a number N (N≥2) of binary input generation modules 200-202, a polarization module 210 and a processing module 215. Each binary input generation module 200-202 provides a component of a binary input vector U=[$U_1, \ldots, U_N$] to the polarization module 210. Each binary input generation module 200-202 comprises an ECC encoding module, such as a turbo code encoding module, a LDPC encoding module or a polar code encoding module, generating the binary input vector U from a binary application vector received from an application module not represented. The polarization module 210 comprises a polarization kernel $K_N$. The polarization module 210 uses the polarization kernel $K_N$ to apply a channel polarization to the binary input vector U.

Any square logical matrix, i.e., any square matrix made of coefficients equal to "0" or "1", can be used as a polarization matrix. However, some polarization matrices have better properties than others. In an embodiment, the polarization matrix representing the polarization kernel $K_N$ in the following, is a N×N logical matrix with the following properties:

in order to avoid a degradation of the equivalent channel capacity by the channel polarization, the polarization matrix has a full rank.

the polarization matrix has at least two coefficients equal to "1" in at least one row in order to insure a mixing of at least two parallel input channels.

In an embodiment, the polarization matrix has the following shape:

$$K_N = \begin{bmatrix} 1 & 0 & \cdots & \cdots & 0 \\ \vdots & \ddots & \ddots & & \vdots \\ \vdots & & \ddots & \ddots & \vdots \\ \vdots & & & \ddots & 0 \\ 1 & 1 & \cdots & 1 & 1 \end{bmatrix}$$

where the coefficients of the main diagonal, the coefficients of the last row are all equal to "1", coefficients above the main diagonal are all equal to "0", remaining coefficients are either equal to "0" or "1".

With such polarization kernel shape, the number of possible polarization kernels of size N is equal to $$2^{\frac{(N-2)(N-1)}{2}}.$$

The $$2^{\frac{(N-2)(N-1)}{2}}$$

polarization kernels form a pre-defined set of polarization kernels.

In an embodiment, a polarization kernel for N=3 is:

$$K_3 = \begin{bmatrix} 1 & 0 & 0 \\ 0 & 1 & 0 \\ 1 & 1 & 1 \end{bmatrix}$$

In an embodiment, a polarization kernel for N=3 is:

$$K_3 = \begin{bmatrix} 1 & 0 & 0 \\ 1 & 1 & 0 \\ 1 & 0 & 1 \end{bmatrix}$$

In an embodiment, a polarization kernel for N=4 is:

$$K_4 = \begin{bmatrix} 1 & 0 & 0 & 0 \\ 0 & 1 & 0 & 0 \\ 0 & 1 & 1 & 0 \\ 1 & 0 & 1 & 1 \end{bmatrix}$$

In an embodiment, a polarization kernel for N=4 is:

$$K_4 = \begin{bmatrix} 1 & 0 & 0 & 0 \\ 1 & 1 & 0 & 0 \\ 0 & 1 & 1 & 0 \\ 0 & 0 & 1 & 1 \end{bmatrix}$$

In an embodiment the polarization kernel is adapted to the number of binary input generation modules, i.e., the size N of the polarization matrix N×N is equal to the number N of binary input generation modules and consequently to the size of the binary input vector U.

The channel polarization of the binary input vector U by the kernel $K_N$ allows obtaining a binary polarized vector X=[$X_1, \ldots, X_N$]. The modulation module 22 receives the binary polarized vector X and applies a modulation to said vector. The modulation is for example a BPSK (Binary Phase Shift Keying) modulation. Each component of the modulated binary polarized vector X is then transmitted on a BF sub-channel affected by an AWGN (Additive White Gaussian Noise) noise. Each AWGN noise has a SNR $\rho_i$ where $\rho_i$ is a random variable depending on a random variable $\alpha_i$ (called random fading variables $\alpha_i$ in the following) representative of the fading on the i-th BF sub-channel, the random fading variables $\alpha_i$ being independent on each BF sub-channel:

$$\rho_i = \gamma |\alpha_i|^2$$

where γ is a parameter representative of a long term SNR on each BF sub-channel, the long term SNR being identical on each BF sub-channel and is equal to the average of the averaged values $\rho_i$ in time, when the receiver and transmitter do not move. When the transmitter and the receiver move, the long term SNR γ varies slowly enough to allow a robust tracking and prediction at the transmitter for a point-to-point transmission. The random fading variables $\alpha_i$ might have different probability distributions from one sub-channel to another, and for example have different variance or mean, which can also be tracked as for the long term SNR γ. When addressing a broadcast service, the long term SNR γ is virtually set as the design point allowing defining the coverage of the system. The BF sub-channels form the equivalent channel. The result of a transmission of the modulated binary polarized vector X on the equivalent channel is an output vector $Y=[Y_1, \ldots, Y_N]$.

In the following, we show that designing the ECC system 20 in the context of a BF channel amounts in searching a polarization kernel and rates (called design rates in the following) of the ECC codes implemented by the ECC encoding modules comprised in each binary input generation modules 200-202 allowing minimizing a probability that an instantaneous equivalent channel capacity is below the transmission rate N·R which is transmitted on the N BF sub-channels.

The processing module 215 controls the binary input generation modules 200-202 and the polarization module 210. In an embodiment, the processing module 215 determines the features of the ECC system 20.

Figure 2C:
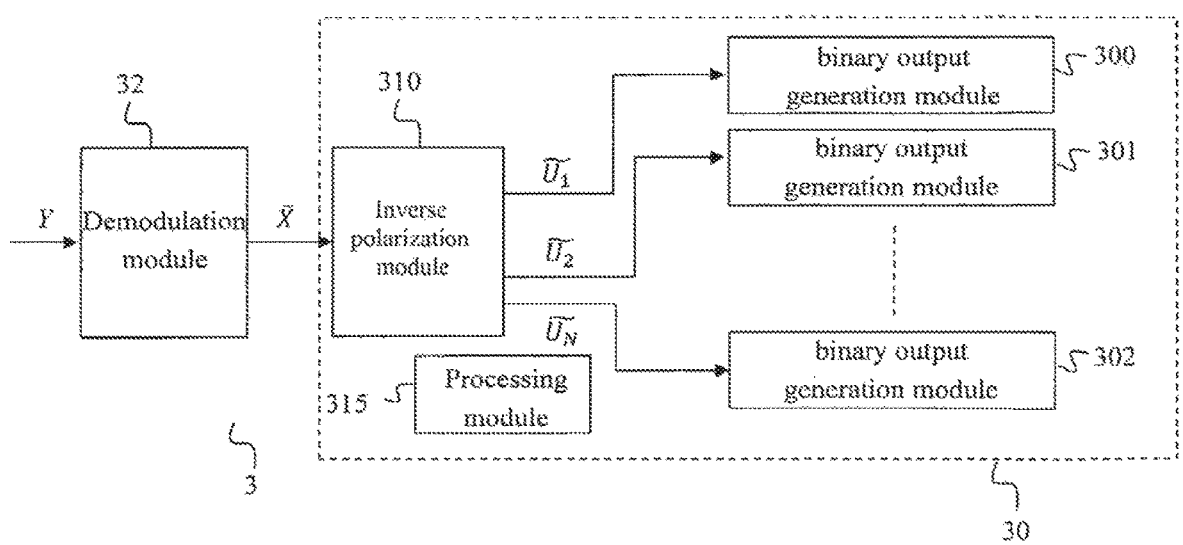
FIG. 2C illustrates schematically an example of receiver system adapted to implement the invention.

FIG. 2C illustrates schematically an example of receiver system adapted to implement the invention.

The receiver system 3 comprises a demodulation module 32 and an inverse ECC system 30. The inverse ECC system 30 comprises an inverse polarization module 310, binary output generation modules 300-302 and a processing module 315.

The demodulation module 32 receives the output vector Y and applies a demodulation to said vector corresponding to the modulation applied by the modulation module 22. The demodulation of the output vector Y allows obtaining a demodulated vector $\tilde{X}=[\tilde{X}_1, \ldots, \tilde{X}_N]$. An inverse polarization is then applied by the inverse polarization module 310 to the demodulated vector $\tilde{X}$ to obtain a vector $\tilde{U}=[\tilde{U}_1, \ldots, \tilde{U}_N]$. The inverse polarization corresponds to the polarization applied by the polarization module 210. Each component of the vector U is then provided to one of the binary output generation modules 300-302. The binary output generation modules 300-302 comprise ECC decoding modules corresponding to the ECC encoding modules comprised in the binary input modules 200-202.

The demodulation module 32, the inverse polarization module 310, the ECC decoding modules of the binary output generation modules 300-302 can implement soft-input soft-output techniques and exchange soft information with each other.

In a first example of the receiver system 3, the demodulation module 32 generates soft bits, for example in the form of Log-Likelihood-Ratios (LLR), from the observations Y (i.e., the output vector Y). Then, the inverse polarization module 310 generates soft bits estimates of the component $\tilde{U}_1$ of the vector $\tilde{U}$. The binary output generation module 300 takes a decision on the information bits corresponding to the binary input generation module 200, which are converted back into hard estimates of the component $U_1$ of the binary input vector U that are used for generating better estimates of the component $\tilde{U}_1$ of the vector $\tilde{U}$ by using a serial cancellation approach, and so on until the decoding is performed by the binary output generation module 302.

In a second example of the receiver system 3, a belief propagation approach is used. In this approach the inverse polarization module 310 generates soft estimates of the binary vector $\tilde{U}=[\tilde{U}_1, \ldots, \tilde{U}_N]$ from soft estimates of the demodulated vector $\tilde{X}=[\tilde{X}_1, \ldots, \tilde{X}_N]$ and soft estimates of the vector $\tilde{U}=[\tilde{U}_1, \ldots, \tilde{U}_N]$ computed by the binary output generation modules 300-302 in previous decoding iterations. The components $\tilde{U}_l$ of the soft estimates of the vector $\tilde{U}=[\tilde{U}_1, \ldots, \tilde{U}_N]$ are computed from components $\tilde{U}_l$ of soft estimates of the vector $\tilde{U}$ provided by the inverse polarization module 310 in previous decoding iterations. The scheduling of the operation has a small impact on the performance, and in general, the soft estimates are related to extrinsic information in order to ensure convergence of the decoding to optimal performances.

The processing module 315 controls the binary output generation modules 300-302 and the inverse polarization module 310. In an embodiment the processing module 315 determines the features of the ECC system 20 from which are derived the features of the inverse ECC system 30.

Figure 3A:
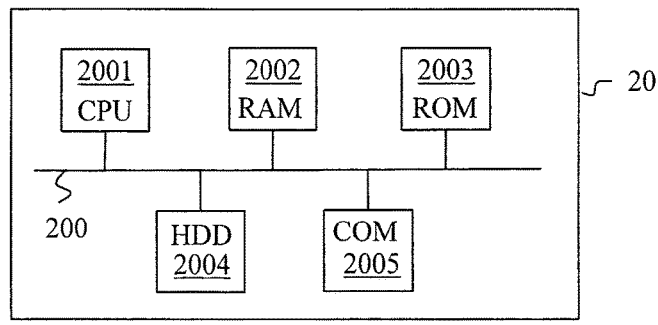
FIG. 3A illustrates schematically an example of a hardware architecture of an error correcting code system according to the invention.

FIG. 3A illustrates schematically an example of a hardware architecture of processing module 215.

According to the shown architecture, the processing module 215 comprises the following components interconnected by a communication bus 2000: a processor, microprocessor, microcontroller or CPU (Central Processing Unit) 2001; a RAM (Random-Access Memory) 2002; a ROM (Read-Only Memory) 2003; storage means such as a HDD (Hard-Disk Drive) 2004, or any other device adapted to read information stored by storage means; and a communication interface 2005.

The communication interface 2005 allows the processing module 215 to receive information representative of the wireless channel 4 and to control the binary input generation modules 200-201 and the polarization module 210.

CPU 2001 is capable of executing instructions loaded into RAM 2002 from ROM 2003 or from an external memory, such as a SD card or the HDD 2004. After the processing module 215 has been powered on, CPU 2001 is capable of reading instructions from RAM 2002 and executing these instructions. The instructions form a computer program that causes CPU 2001
  to control the binary input generation modules 200-202 and the polarization module 210,
  and, in an embodiment, to apply the methods described in relation with FIGS. 5 and 6.

Figure 5:
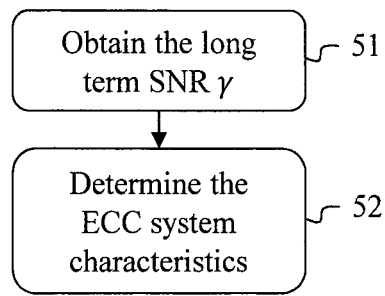
FIG. 5 illustrates schematically an example of a method allowing determining features of an error correcting code system according to the invention.
Figure 6:
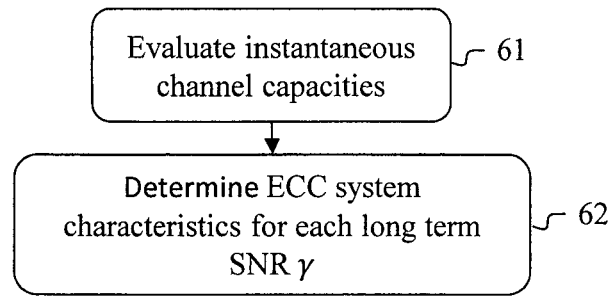
FIG. 6 illustrates schematically an example of a statistical method for determining features of an error correcting code system for a plurality of values of a long term SNR.

The application of the methods described in relation with FIGS. 5 and 6, may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

Figure 3B:
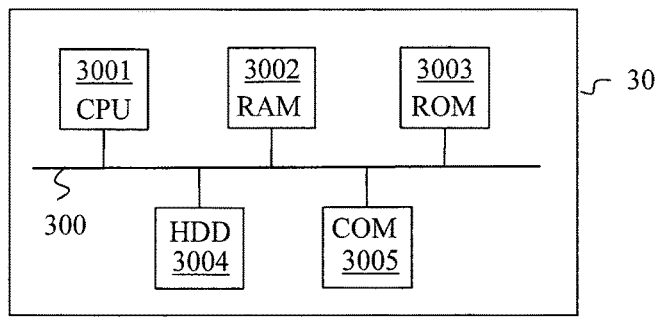
FIG. 3B illustrates schematically an example of a hardware architecture of an inverse error correcting code system according to the invention.

FIG. 3B illustrates schematically an example of a hardware architecture of the processing module 315.

According to the shown architecture, the processing module 315 comprises the following components interconnected by a communication bus 3000: a processor, microprocessor, microcontroller or CPU (Central Processing Unit) 3001; a RAM (Random-Access Memory) 3002; a ROM (Read-Only Memory) 3003; storage means such as a HDD (Hard-Disk Drive) 3004, or any other device adapted to read information stored by storage means; and a communication interface 3005.

The communication interface 3005 allows the processing module 315 to receive information representative of the wireless channel 4 and to control the binary output generation modules 300-302 and the inverse polarization module 310.

CPU 3001 is capable of executing instructions loaded into RAM 3002 from ROM 3003 or from an external memory, such as a SD card or the HDD 3004. After the polarization module 315 has been powered on, CPU 3.001 is capable of reading instructions from RAM 3002 and executing these instructions. The instructions form one computer program that causes CPU 3001
- to control the binary output generation modules 300-302 and the inverse polarization module 310.
- and, in an embodiment, to apply the methods described in relation with FIGS. 5 and 6.

The inverse polarization and ECC decoding, and the application of the methods described in relation with FIGS. 5 and 6, may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

Figure 4:
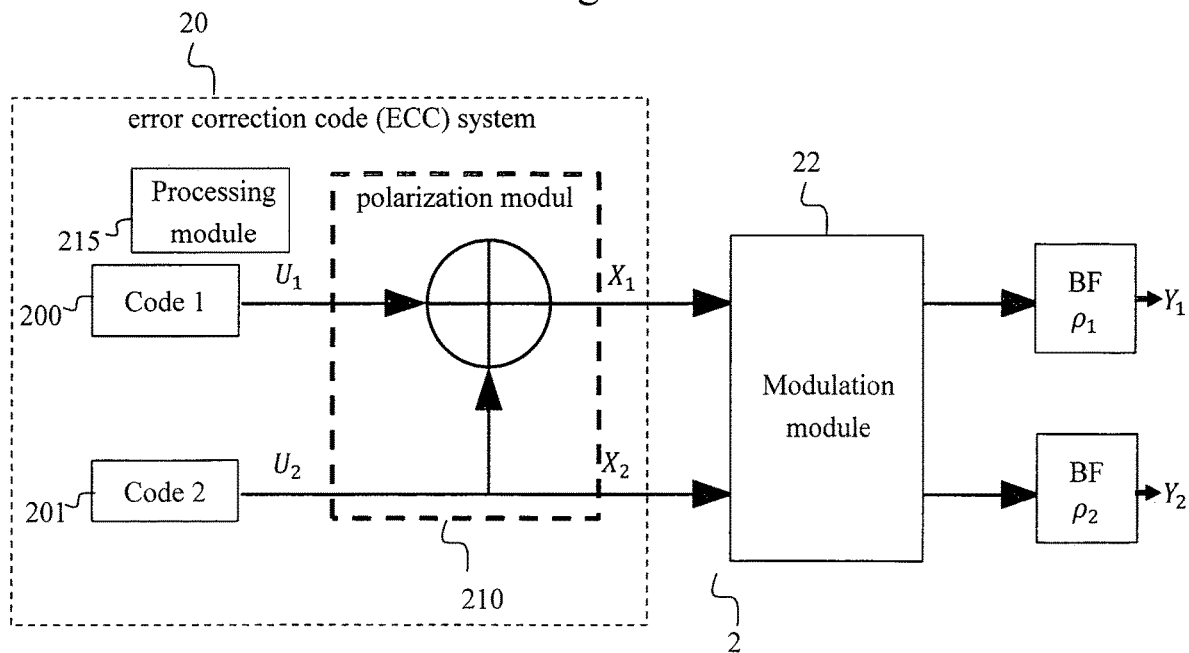
FIG. 4 illustrates schematically an example of channel polarization of outputs of two error correcting code modules.

FIG. 4 illustrates schematically an example of channel polarization of outputs of two error correcting code modules.

In FIG. 4, a transmission system 2, comprises an ECC system 20 and a modulation module 22. The ECC system 20 comprises a binary input generation module 200 comprising an ECC module implementing an ECC code, named code 1, a binary input generation module 201 comprising an ECC module implementing an ECC code, named code 2, a polarization module 210 and a processing module 215. The code 1 and the code 2 are, for example, a turbo code, a LDPC code or a polar code. The binary input generation modules 200 and 201 generate binary input vectors $U=[U_1, U_2]$ which are input to a polarization module 210. In FIG. 4, the polarization module 210 is the polarization kernel $K_2$. From each binary input vector U, the polarization module 210 generates a binary polarized vector $X=[X_1, X_2]$ which is input to the modulation module 22. The modulated binary polarized vector X is then transmitted to the equivalent channel. The equivalent channel comprises two BF sub-channels affected respectively by an AWGN noise leading to a SNR $\rho_i = \gamma |\alpha_i|^2$ (with i=1 or 2). The output of the equivalent channel is an output vector $Y=[Y_1, Y_2]$.

A simplistic case arises when the characteristics of the fading are known (i.e., random fading variables $\alpha_i$ are fixed). In this simplistic case, it is known that the channel polarization leads to a first BF sub-channel with a SNR $S_2 = \rho_i + \rho_2$ under a knowledge of a second BF sub-channel input, the second BF sub-channel having a SNR $S_i$ that can be computed from a channel capacity conservation property. If the characteristics of the fading are known by the transmission system 2, a design of the ECC system 20 comprises the following steps:
- obtaining the long term SNR γ: The long term SNR γ can be computed regularly by the receiver system 30 and forwarded to the transmission system 20.
- designing the code 1 and the code 2 for respectively the SNR $S_1$ and the SNR $S_2$ according to known methods.

This leads to two independent ECC codes linked by a kernel of size "2". If the ECC codes are capacity achieving, by designing them for reaching the capacity of the AWGN channels with respectively SNR $S_1$ and $S_2$, it can be shown that the ECC system 20 exhibits good performances. However, it requires the knowledge of the random fading variables $\alpha_i$, which is generally not available on the transmission system side in open loop or high speed systems.

An objective of the invention is to design the ECC system 20 in a more realistic case where the realizations of the random fading are not known on the transmission system 2 side, but only the long term SNR γ. Note that the design of the inverse ECC system 30 can be deduced from the design of the ECC system 20.

It is difficult to design the ECC system 20 for a BF channel for which the realizations of the random fading are not known. Indeed, this ECC system 20 is to be optimized in a quasi-static open-loop system where only the long term SNR γ is known. The ECC system 20 (the rates of the ECC codes and the polarization kernel features) cannot be optimized for each realization of the random fading variables $\alpha_i$ but only in a statistical way.

In addition, optimizing the ECC system 20 requires defining a metric allowing comparing performances of different possible configurations of the ECC system 20.

The invention proposes a method, described below in relation with FIG. 5 allowing determining features of the ECC system 20 based on a use of an outage probability $P_{out}$ representative of the performance of the ECC system 20. The outage probability $P_{out}$ is defined as a probability that an instantaneous equivalent channel capacity (being random as a result of channel characteristics variations) is below a transmission rate N·R which is transmitted on the N BF sub-channels, leading to a so-called outage event.

FIG. 5 illustrates schematically an example of a method allowing determining features of an error correcting code system according to the invention.

The method of FIG. 5 is used to determine features of the ECC system 20 comprising N binary input generation modules where the number N≥2, the particular case where N=2 being represented in FIG. 4.

In a step 51, the processing module 215 obtains a couple of data comprising a value representative of the long term SNR γ and a set, called probability distribution set, comprising, for each i-th BF sub-channel (i∈[1; N]), a probability density function representative of the probability distribution of the random fading variables $\alpha_i$. The long term SNR γ and the probability density functions are for instance regularly estimated by the receiver system 3 and forwarded to the ECC system 20. If the probability density functions cannot be estimated, one can assume that the random fading variables $\alpha_i$ have a complex Gaussian distribution.

In a step 52, the processing module 215 determines features of the ECC codes implemented by the ECC modules comprised in each binary input generation module 200-202 and a polarization kernel $K_N$ adapted to the obtained couple of data comprising the value representative of the long term SNR γ and the probability distribution set. The step 52 allows obtaining a set of design rates $(r_1, r_2, \ldots, r_N)$ leading to an average transmission rate $R=\Sigma_{i=1}^{N} r_i/N$, and a kernel $K_N$ adapted to the obtained long term SNR γ and to the probability distribution set and allowing minimizing the outage probability $P_{out}$ for an average transmission rate $R=\Sigma_{i=1}^{N} r_i/N$. Each design rate $r_i$ is a design rate of the ECC codes (called i-th ECC code in the following) implemented by the ECC modules comprised in the i-th binary input generation module of the ECC system 20. The polarization kernel $K_N$ belongs, for example, to the pre-defined set of $$2^{\frac{(N-2)(N-1)}{2}}$$

possible polarization kernels of size N defined in relation with FIG. 2B. In the example of FIG. 4, the set of design rates comprises the design rate $r_1$ of code 1 and the design rate $r_2$ of code 2 and the polarization kernel is $K_2$.

In an embodiment, the set of design rates $(r_1, r_2, \ldots, r_N)$ leading to an average transmission rate $R=\sum_{i=1}^{N} r_i/N$ and the kernel $K_N$ minimizing the outage probability $P_{out}$ for the obtained couple of data comprising the value representative of the long term SNR $\gamma$ and the probability distribution set are obtained from a table stored in the storage means 2005 of the processing module 215. Said table, called correspondence table, has been computed off-line, according to a process described in FIGS. 6, 7A and 7B, for example by the processing module 215 when the processing module 215 was powered-on for the first time. The correspondence table associates to each value of a set of values of the long term SNR, to each probability distribution set of a plurality of probability distribution sets and to each average transmission rate R of a set of average transmission rates, a set of design rates $(r_1, r_2, \ldots, r_N)$ and a kernel $K_N$ minimizing the outage probability $P_{out}$ for said value of the long term SNR $\gamma$, said probability distribution set, and said average transmission rate R. In an embodiment, the values of the long term SNR $\gamma$ represented in the table are comprised in a pre-defined set of possible values of the long term SNR $\gamma$. The probability distribution sets are comprised in a pre-defined plurality of probability distribution sets. The average transmission rates are comprised in a pre-defined set of transmission rates. Thus, it is possible to determine for each long term SNR $\gamma$ of pre-defined set of possible values of the long term SNR $\gamma$, each probability distribution set of the pre-defined plurality of probability distribution sets, and for each average transmission rate R of the pre-defined set of average transmission rates, the set of design rates $(r_1, r_2, \ldots, r_N)$ minimizing the outage probability $P_{out}$. Furthermore, this can be used to determine, for each long term SNR $\gamma$ and each probability distribution set of a plurality of probability distribution sets, the best average transmission rate R and associated set of design rates $(r_1, r_2, \ldots, r_N)$ that maximizes a throughput of the ECC system 20 when an automatic repetition request (ARQ) retransmission protocol is used between the receiver and transmitter, by selecting the average transmission rate R maximizing a value $R(1-P_{out})$ representative of said throughput among the pre-defined set of average transmission rates and associated outage probability $P_{out}$ being a function of the transmission rate R. One can note that selecting the best average transmission rate R is equivalent to select the best transmission rate N·R transmitted on the N BF sub-channels, the transmission rate N·R being the sum of the design rates $r_1, r_2, \ldots, r_N$. Consequently, maximizing the throughput of the ECC system 20 with respect to the average transmission rate R by testing a plurality of average transmission rates is equivalent to maximizing the throughput of the ECC system 20 with respect to the transmission rate R by testing a plurality of transmission rates.

Once the features of the ECC system 20 have been determined by the processing module 215, the ECC system 20 generates binary polarized vectors X using the features of the ECC system 20 determined in step 52 and provides said binary polarized vectors to the modulation module 22, which insures the modulation of said vectors before their transmission. More precisely, each binary input vector U is generated by the ECC codes implemented by the ECC modules comprised in the binary input generation module 200-202 using the set of design rates $(r_1, r_2, \ldots, r_N)$ and the polarized vector X is generated by the polarization module 210 using the polarization kernel $K_N$.

As can be seen from the above, the determination of the features of the ECC system for a given long term SNR $\gamma$, a given probability distribution set and a given average transmission rate R, is based on determinations of outage probabilities $P_{out}$. As a reminder, the outage probability is defined as a probability that an outage event occurs, where an outage event occurs when an instantaneous equivalent channel capacity is below the transmission rate N·R. The outage event can be represented by the following inequality:

$$\sum_{i=1}^{N} I(U_i; Y_i) < N \cdot R$$

where the instantaneous equivalent channel capacity is a combination of N BF sub-channels capacities, each represented by the mutual information between the input and the output of the corresponding BF sub-channel.

Knowing that, in the case of AWGN channels with discrete input, the channel mutual information is a function of the SNR of the channel, the outage event can be written as follows:

$$\sum_{i=1}^{N} \bar{I}(\rho_i) < N \cdot R$$

where $I(U_i; Y_i) = \bar{I}(\rho_i)$. In the case of a binary modulation, the mutual information is computed as $$\bar{I}(\rho_i) = E[1 - \log_2(1 + e^{-L})]$$

where the random variable L is a LLR of the corresponding BDMC. In the case of an AWGN, the LLR is Gaussian distributed with a mean equal to 4 times the SNR of said BDMC and a variance equal to 8 times the SNR of said BDMC. This function $\bar{I}(.)$ can be computed offline and tabulated. Since it is a non-decreasing function, the inverse function $\bar{I}^{-1}(.)$ can also be tabulated, such that $\bar{I}^{-1}(\bar{I}(x)) = x$ for all x.

The outage probability $P_{out}$ can then be written as follows:

$$P_{out} = P\left(\sum_{i=1}^{N} \bar{I}(\rho_i) < N \cdot R\right)$$

where P(E) is a probability that an event E occurs.

In the case represented by FIG. 4, the outage event can be represented by the following inequality:

$$I(U_1; Y_1) + I(U_2; Y_2) < 2R$$

Equivalently, the outage event can be written as follows:

$$\bar{I}(\rho_1) + \bar{I}(\rho_2) < 2 \cdot R$$

The outage probability $P_{out}$ is written as follows:

$$P_{out} = P(\bar{I}(\rho_1) + \bar{I}(\rho_2) < 2 \cdot R)$$

Computing the outage probability, i.e., the probability that an instantaneous equivalent channel capacity is below the transmission rate NR is difficult, and designing an error correcting code to achieve this outage probability is even more difficult.

In order to circumvent this difficulty, in an embodiment, the outage probability is upper-bounded by the processing module 215 by assuming that an independent ECC encoding strategy is used on an equivalent channel corresponding to the channel created by the polarization module 210. In that case, each component of a binary input channel is assumed to be transmitted on BF sub-channels, called polarized BF sub-channels in the following, of the equivalent channel created by the polarization module. With the independent ECC encoding strategy assumption, an upper-bound of the outage probability, called approximated outage probability $\widetilde{P_{out}}$, is computed as a probability that an instantaneous channel capacity of at least one polarized BF sub-channel $J_i(\rho_1, \rho_2, \ldots, \rho_N)$ is below a design rate of the ECC code associated to the component of the binary input channel intended to be transmitted on said polarized BF sub-channel. The corresponding outage event can be written as follows:

For at least one $i \in [1; N]$, $J_i(\rho_1, \rho_2, \ldots, \rho_N) < r_i$ where $r_i$ is the design rate of the i-th ECC code, and $J_i(\rho_1, \rho_2, \ldots, \rho_N)$ is the instantaneous channel capacity of the polarized BF sub-channel observed by the i-th ECC code.

$$J_i(\rho_1, \rho_2, \ldots, \rho_N) = I(U_i; Y|U_1, \ldots, U_{i-1}, \rho_1, \rho_2, \ldots, \rho_N)$$

$I(U_i; Y|U_1, \ldots, U_{i-1}, \rho_1, \rho_2, \ldots, \rho_N)$ is the mutual information between the component $U_i$ of the binary input vector U provided by the i-th ECC code and the output vector Y, knowing each component $U_x$ for $x \in [1; i-1]$ with which the component $U_i$ interferes after channel polarization by the polarization module 210 and a set $(\rho_1, \rho_2, \ldots, \rho_N)$ comprising the SNR $\rho_y$ for $y \in [1; N]$ of each BF sub-channel. The mutual information $I(U_i; Y|U_1, \ldots, U_{i-1}, \rho_1, \rho_2, \ldots, \rho_N)$ (and consequently the instantaneous channel capacity $J_i(\rho_1, \rho_2, \ldots, \rho_N)$) depends on the kernel used in the polarization module.

The approximated outage probability is noted as follows:

$$\widetilde{P_{out}} = P(\text{For at least one } i \in [1; N], J_i(\rho_1, \rho_2, \ldots, \rho_N) < r_i)$$

In the example of FIG. 4, the approximated outage probability $\widetilde{P_{out}}$ is as follows:

$$\widetilde{P_{out}} = P(J_1(\rho_1, \rho_2) < r_1 \text{ or } J_2(\rho_1, \rho_2) < r_2)$$

and the code 2, after channel polarization, observes an instantaneous channel capacity $J_2(\rho_1, \rho_2) = \bar{I}(\rho_1 + \rho_2)$. By using the capacity conservation property inherent to channel polarization, the code 1 observes an instantaneous channel capacity equal to $J_1(\rho_1, \rho_2) = \bar{I}(\rho_1) + \bar{I}(\rho_2) - \bar{I}(\rho_1 + \rho_2)$ which can be obtained by tabulation of the function $\bar{I}(.)$.

It can be shown that, if $r_1$ and $r_2$ are the design rates associated respectively to the code 1 and the code 2 for the SNR $\gamma$ and the average transmission rate R and if code 1 and code 2 are capacity achieving, then an optimal couple of design rates $(r_1, r_2)$ is such that $$\frac{r_1}{2} + \frac{r_2}{2} = R,$$

for any long term SNR $\gamma$ and any average transmission rate R and any probability distribution set, which limits the search on the one-dimensional segment $r_2 = 2R - r_1$;

for a given long term SNR $\gamma$, a given probability distribution set and a given average transmission rate R, it is possible to compute a value representative of the approximated outage probability $\widetilde{P_{out}}$ when the design rates of the code 1 and the code 2 are $(r_1, r_2)$ either by:

computing a Monte-Carlo simulation on the random variables $\rho_1$ and $\rho_2$ of the outage rate, by counting an error when $J_1(\rho_1, \rho_2) < r_1$ or when $J_2(\rho_1, \rho_2) < r_2$. Knowing that $\rho_i = \gamma |\alpha_i|^2$, computing a numerical integration of a product of probability density functions of SNR $\rho_1$ and $\rho_2$ on regions where $J_1(\rho_1, \rho_2) < r_1$ or $J_2(\rho_1, \rho_2) < r_2$. Knowing that $\rho_i = \gamma |\alpha_i|^2$, the probability density function of a SNR $\rho_i$ is determined using the long term SNR $\gamma$ and the probability density functions of the random fading variables $\alpha_i$.

using an approximation leading to $$\widetilde{P_{out}} \lesssim 1 - \left(1 + \frac{|\bar{I}^{-1}(r_1) - \bar{I}^{-1}(2R - r_1)|}{\gamma}\right) e^{-\frac{\bar{I}^{-1}(r_1) + \bar{I}^{-1}(2R - r_1)}{\gamma}}$$

As a result, an upper bound of the system performance, given by the approximated outage probability $\widetilde{P_{out}}$, varies according to the SNR $\rho_i$ probability distribution (i.e., according to the long term SNR $\gamma$ and the probability distribution set), the average transmission rate R and the design rate $r_1$, the design rate $r_2$ depending on $r_1$ ($r_2 = 2R - r_1$). Note that, for the polarization to operate, $r_2$ should be higher than $r_1$. By testing all possible values of $r_1$ for a given R, a given long term SNR $\gamma$ and a given probability distribution set, it is possible to determine the value of the design rate $r_1$ minimising the approximated outage probability $\widetilde{P_{out}}$ and then to deduce $r_2$, the polarization kernel being $K_2$.

In a more general case, when $N > 2$, the determination of the ECC system 20 features relies on a method described below in relation with FIGS. 6, 7A, 7B and 8 allowing to obtain the correspondence table used in step 52. In an embodiment, the method described in FIGS. 6, 7A, 7B and 8 is implemented offline.

FIG. 6 illustrates schematically an example of a statistical method for determining features of an error correcting code system for a plurality of values of a long term SNR.

In a step 61, the processing module 215 evaluates for each polarized BF sub-channel, an instantaneous channel capacity $J_i(\rho_1, \rho_2, \ldots, \rho_N)$ for each possible set of SNR $(\rho_1, \rho_2, \ldots, \rho_N)$ and each possible polarization kernel of size N. The step 61 is described in details in relation with FIG. 7A.

In a step 62, the processing module 215 obtains a pre-defined set of values of the long term SNR $\gamma$, a pre-defined plurality of probability distribution sets and a pre-defined set of average transmission rates. For each value of the long term SNR $\gamma$ of the pre-defined set of values of the long term SNR $\gamma$, for each probability distribution set of the pre-defined plurality of probability distribution sets and for each average transmission rate of the pre-defined set of average transmission rates R, the processing module 215 uses the instantaneous channel capacities $J_i(\rho_1, \rho_2, \ldots, \rho_N)$ computed during step 61 to determine a set of design rates $(r_1, r_2, \ldots, r_N)$ and a kernel $K_N$ minimizing the approximated outage probability $\widetilde{P_{out}}$ for said value of the long term SNR γ and said probability distribution set and said average transmission rate R. The step 62 is detailed in relation with FIG. 7B. During step 62, the processing system 215 creates the correspondence table wherein each possible triplet made of a value of the long term SNR γ of the pre-defined set of values of the long term SNR γ, a probability distribution set of the pre-defined probability distribution sets and an average transmission rate of the pre-defined set of average transmission rates is associated to a set of design rates ($r_1$, $r_2$, ..., $r_N$) and to a kernel $K_N$. The correspondence table is then used during step 52 each time the processing module 215 obtains a new value of the long term SNR γ or new probability distribution set.

In an embodiment during step 62, the processing system 215 creates the correspondence table wherein each possible couple made of a value of the long term SNR γ of the pre-defined set of values of the long term SNR γ and a probability distribution set of the pre-defined probability distribution sets is associated to a set of design rates ($r_1, r_2, \ldots, r_N$), to a kernel $K_N$, the average transmission rate R being deduced from the design rates ($r_1, r_2, \ldots, r_N$).

Figure 7A:
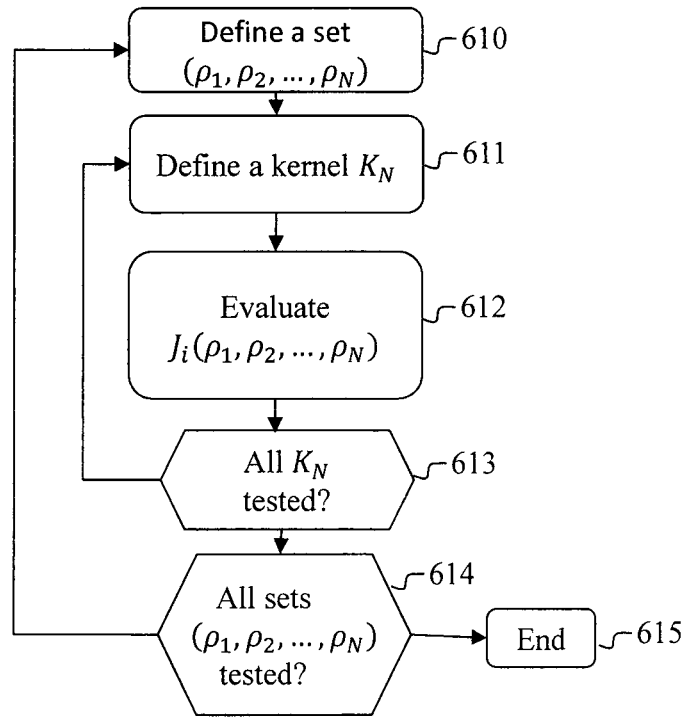
FIG. 7A illustrates schematically an example of a method for evaluating instantaneous channel capacities of BF sub-channels.

FIG. 7A illustrates schematically an example of a method for evaluating an instantaneous channel capacity of polarized BF sub-channels.

In a step 610, the processing module 215 defines a set of SNR ($\rho_1, \rho_2, \ldots, \rho_N$) wherein a SNR $\rho_i$ is the SNR of the AWGN noise affecting the i-th BF sub-channel. Note that the values of the SNR $\rho_i$ are chosen in a pre-defined set of possible values of the SNR $\rho_i$.

In a step 611, the processing module 215 defines a kernel $K_N$ of size N. The kernel $K_N$ belongs to the pre-defined set of the $$2^{\frac{(N-2)(N-1)}{2}}$$

polarization kernels of size N.

In a step 612, the processing module 215 evaluates, for each polarized BF sub-channel of the equivalent channel obtained by polarization by the polarization module 210, the instantaneous channel capacities $J_i(\rho_1, \rho_2, \ldots, \rho_N)$ for the set of SNR ($\rho_1, \rho_2, \ldots, \rho_N$) and the polarization kernel $K_N$. The instantaneous channel capacities $J_i(\rho_1, \rho_2, \ldots, \rho_N)$ can be evaluated, as described in the following in relation with FIG. 8, by using, for example, a Monte-Carlo simulation and a belief propagation decoding on the kernel $K_N$ with a genie-aided method that assumes perfect a priori input for the inputs $U_1, \ldots, U_{i-1}$ and considers the computation of extrinsic probabilities of the input bits $U_1, \ldots, U_{i-1}$.

In a step 613, the processing module 215 determines if all possible kernels of size N have been considered. If all possible kernels of size N have been considered, the processing module 215 continues with a step 614. Otherwise, the processing module 215 goes back to the step 611 and defines a new kernel of size N different from kernels of size N already considered.

In the step 614, the processing module 215 determines if all possible sets of SNR ($\rho_1, \rho_2, \ldots, \rho_N$) have been considered. If all possible sets of SNR ($\rho_1, \rho_2, \ldots, \rho_N$) have been considered, the method described in relation with FIG. 7A ends. Otherwise, the processing module 215 goes back to the step 610 and defines a new set of SNR ($\rho_1, \rho_2, \ldots, \rho_N$) different from sets of SNR ($\rho_1, \rho_2, \ldots, \rho_N$) already considered.

Figure 8:
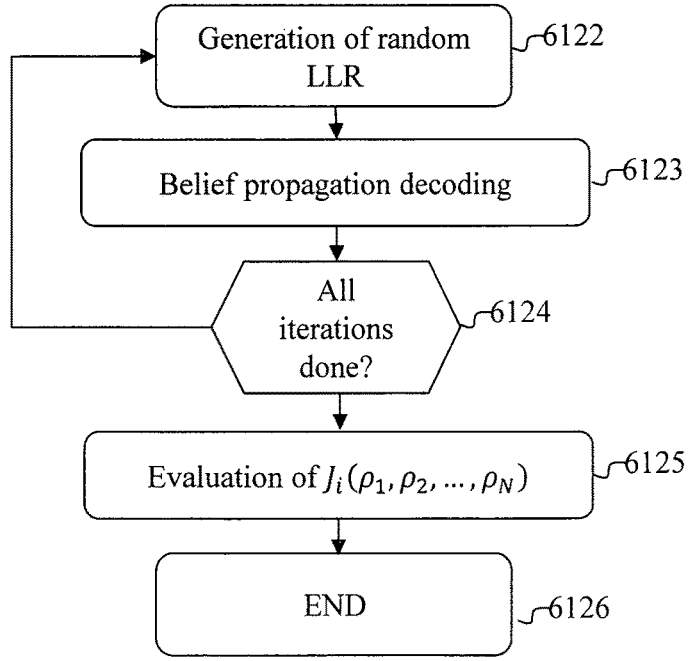
FIG. 8 illustrates schematically an example of Monte-Carlo simulation based process for evaluating instantaneous channel capacities.

FIG. 8 illustrates schematically an example of Monte-Carlo simulation based process for evaluating instantaneous channel capacities. The Monte-Carlo simulation based process corresponds to step 612.

In a step 6122, the processing module 215 generates random Log Likelihood Ratios (LLR) $L_1, L_2, \ldots, L_N$. Each LLR $L_x$ follows a Gaussian distribution $L_i \sim \mathcal{N}(4\rho_i, 8\rho_i)$.

In a step 6123, the processing module 215 performs for each i∈[1; N], a belief propagation decoding with perfect LLR a priori input for the inputs $U_1, \ldots, U_{i-1}$, and a computation of a value $J'_i$ representative of an estimation of the instantaneous channel capacity $J_i(\rho_i, \rho_2, \ldots, \rho_N)$ ($J'_i = 1 - \log_2(1+\exp(-L'_i))$), $L'_i$ being a result of the belief propagation associated to the component $U_i$. The belief propagation is a state of art algorithm used for soft-input/soft output decoding of error correcting codes, with specific implementations for the polar codes. The processing module 215 applies here a belief propagation method described in the article "Recursive Descriptions of Decoding Algorithms and Hardware Architectures for Polar Codes" by Noam Presman and Simon Litsyn (http://arxiv.org/abs/1209.4818).

In a step 6124, the processing module 215 verifies if the number of iterations in the Monte-Carlo simulation based method is sufficient. For instance, in this step the processing module 215 verifies if the number of iterations is equal to a pre-defined number of iterations. If the number of iterations is not sufficient, the processing module 215 returns to step 6122. Otherwise, the processing module 215 evaluates, in a step 6125, an instantaneous channel capacity $J_i(\rho_1, \rho_2, \ldots, \rho_N)$ for each i∈[1; N], each instantaneous channel capacity $J_i(\rho_1, \rho_2, \ldots, \rho_N)$ being the average of the values $J'_i$ computed in each iteration.

In a step 6126 the Monte-Carlo simulation method ends.

Figure 7B:
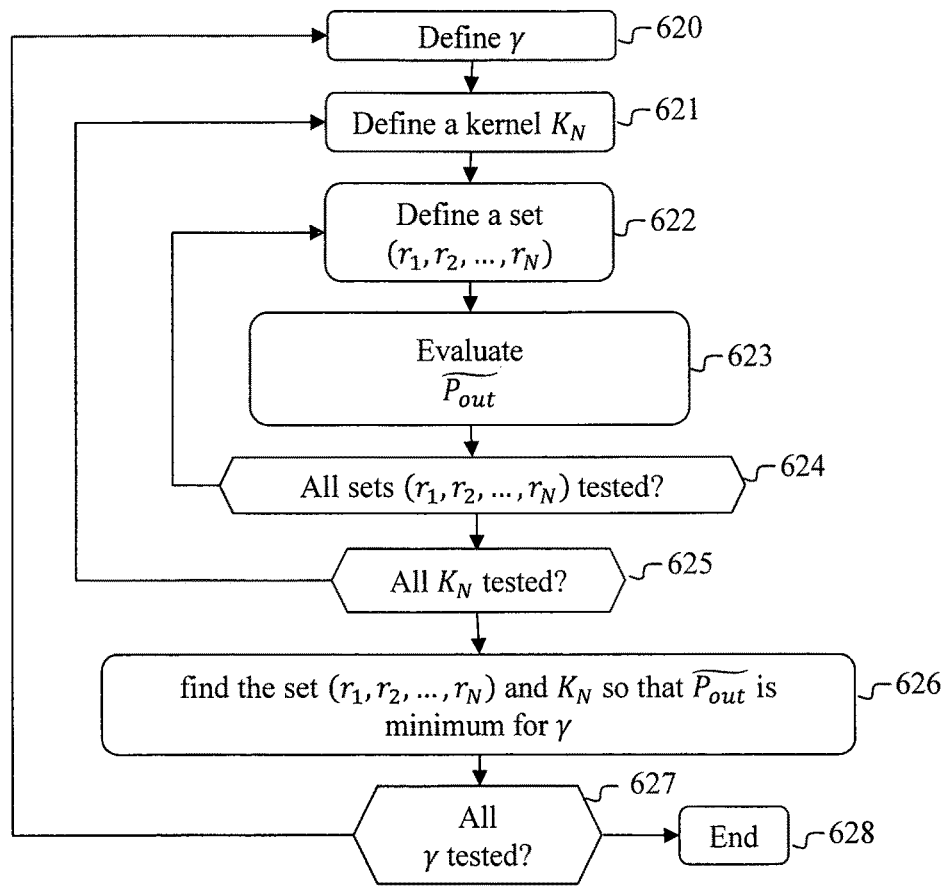
FIG. 7B illustrates schematically a detail of the statistical method for determining features of an error correcting code system for a plurality of values of a long term SNR, a plurality of probability density functions representative of probability distributions of a random variables representative of a fading on BF sub-channels and a plurality of average transmission rates.

FIG. 7B illustrates schematically a detail of the method for determining features of an error correcting code system for a plurality of values of a long term SNR, a plurality of sets of probability density functions representative of probability distributions of a random variables representative of a fading on BF sub-channels, i.e., a plurality of probability distribution sets, and a plurality of average transmission rates. FIG. 7B corresponds to step 62.

In a step 620, the processing module 215 defines a value of the long term SNR γ, a probability distribution set and an average transmission rate R that have not been yet considered. The value of the long term SNR γ is for instance taken in a pre-defined set of values of the long term SNR γ covering a set of possible values of the long term SNR γ. The probability distribution set is for instance taken in a pre-defined plurality of sets of probability distribution sets. The average transmission rate is for example taken in a pre-defined set of average transmission rates.

In a step 621, the processing module 215 defines a kernel of size N $K_N$ that has not been considered yet. The kernel $K_N$ belongs to the predefined set of $$2^{\frac{(N-2)(N-1)}{2}}$$

kernels of size N.

In a step 622, the processing module 215 defines a set of design rates ($r_1, r_2, \ldots, r_N$) different from any set of design rates ($r_1, r_2, \ldots, r_N$) previously considered in the method described in relation with FIG. 7B. Each design rate $r_i$ (i∈[1; N]) is for example taken in a pre-defined set of design rates.

In a step 623, the processing module 215 evaluates the approximated outage probability $\widetilde{P_{out}}$, i.e. the probability that at least one instantaneous channel capacity $J_i(\rho_1, \rho_2, \ldots, \rho_n)$ is lower than $r_i$, by using the instantaneous channel capacities computed in step 61, and according to the probability distribution of the random fading variables $\alpha_i$ represented by the probability density functions of the random fading variables $\alpha_i$. The approximated outage probability $\widetilde{P_{out}}$ can be obtained either
- by a numerical integration of a product of the probability density functions of the SNRs $\rho_1, \rho_2, \ldots, \rho_n$ on a region such that for at least one i, $J_i(\rho_1, \rho_2, \ldots, \rho_n) < r_i$. Again, knowing that $\rho_i = \gamma |\alpha_i|^2$, the probability density function of a SNR $\rho_i$ is determined using the long term SNR $\gamma$ and the probability density functions of the random fading variables $\alpha_i$; or,
- by a Monte-Carlo simulation that generates random realizations of $(\rho_1, \rho_2, \ldots, \rho_n)$ and accumulates an error event if for at least one i, $J_i(\rho_1, \rho_2, \ldots, \rho_n) < r_i$.

In a step 624, the processing module 215 determines if all possible sets of design rates $(r_1, r_2, \ldots, r_N)$ have been tested. If some sets remain, the processing module 215 returns to step 622. Otherwise the processing module 215 continues with a step 625.

In the step 625, the processing module 215 determines if all possible polarization kernels of size N have been considered. If all possible polarization kernels of size N have been considered, the processing module 215 continues with a step 626. Otherwise, the processing module 215 goes back to the step 621 and defines a new polarization kernel of size N different from polarization kernels of size N already considered.

In a step 626, the processing module 215 searches the set of design rates $(r_1, r_2, \ldots, r_N)$ and the polarization kernel $K_N$ minimizing the approximated outage probability $\widetilde{P_{out}}$ for the considered value of the long term SNR $\gamma$ and the considered probability distribution set. The set of design rates $(r_1, r_2, \ldots, r_N)$ and the polarization kernel $K_N$ minimizing the approximated outage probability $\widetilde{P_{out}}$ is then associated to a couple made of the considered long term SNR $\gamma$ and the considered probability distribution set in the correspondence table.

In a step 627, the processing module 215 determines if all possible values of $\gamma$, all possible probability distribution sets and all average transmission rates R have been tested. If some values remain, the processing module 215 returns to step 620. Otherwise, the method described in relation with FIG. 7B ends. At the end of the method described in relation to FIG. 7B, the processing module 215 stores in its storage means 2004 a correspondence table comprising for a plurality of triplets, each triplet being made of a long term SNR $\gamma$, a probability distribution set and an average transmission rate R, a set of design rates $(r_1, r_2, \ldots, r_N)$ and a polarization kernel $K_N$.

In an embodiment, at the end of the method described in relation to FIG. 7B, the processing module 215 stores in its storage means 2004 a correspondence table comprising for a plurality of couples, each couple being made of a long term SNR $\gamma$ and a probability distribution set, a set of design rates $(r_1, r_2, \ldots, r_N)$ and a polarization kernel $K_N$.

In an embodiment, the polarization kernel is predefined in the polarization module 210, and the inverse polarization module 310, and only a set of design rates $(r_1, r_2, \ldots, r_N)$ minimizing the approximated outage probability $\widetilde{P_{out}}$ is determined by the processing module 215 for each possible value of the long term SNR $\gamma$, each possible probability distribution set and each average transmission rate and stored in the correspondence table.

The inverse ECC system 30 applies a decoding method corresponding to the encoding method applied by the ECC system 20 under the control of the processing module 315. Consequently, the ECC system 20 and the inverse ECC system 30 share the features of the ECC system 20.

In an embodiment, when the features of the ECC system 20 have been determined in step 52 by the processing module 215, the processing module 215 transmits these features to the inverse ECC system 30.

In an embodiment, the method described in relation with FIG. 5 and/or the method described in relation with FIG. 6 is/are implemented by the processing module 315. When the method of FIG. 5 is implemented by the inverse processing module 315, the processing module 315 transmits the features of the ECC system 20 to the processing module 215. When the method described in relation with FIG. 6 is implemented by the processing module 315, the processing module 315 transmits the correspondence table to the processing module 215.

In an embodiment the processing module 215 (respectively the processing module 315) is independent of the ECC system 20 (respectively the inverse ECC system 30) and comprised in the transmission system 2 (respectively in the receiver system 3). In an embodiment, the ECC codes implemented in the ECC modules comprised in the binary input generation system 200-202 are turbo-codes. In that case a selection of a puncturing rate allows adapting each ECC code design rate.

In an embodiment, the ECC codes implemented in the ECC modules comprised in the binary input generation system 200-202 are polar codes. In that case an adaptation of a number of frozen bits allows adapting each ECC code design rate, and the position of the frozen bits is designed to achieve good performance.

In an embodiment, the correspondence table is computed in real-time. The method described in relation with FIG. 6 is implemented in real time during step 52.

In an embodiment, the method described in FIG. 6 is implemented in real time. However, during step 62, only one value of the long term SNR $\gamma$ and/or only one probability distribution set is/are considered corresponding to the value of the long term SNR $\gamma$ and the probability distribution set obtained during step 51.

In the above, we have considered that each component $U_i$ of the binary input vector U has the same size. The invention applies also when the components $U_i$ have different sizes by dividing the components $U_i$ in a plurality of sub-components of the same size.

Note that, in the above, all ECC codes are considered to be capacity achieving.

The invention claimed is:

1. A method for determining a transmission rate features of an error correcting code system which improves throughput, the error correcting code system including independent error correcting codes, a polarization module, and a modulation module transmitting a binary input vector on block fading (BF) sub-channels, each BF sub-channel being affected by an Additive White Gaussian Noise with a signal to noise ratio independently represented on each BF sub-channel by a corresponding first random fading variable and a probability density function representative of a probability distribution of the first random fading variable representative of a fading on a respective BF sub-channel, and a long term SNR parameter, identical on each BF sub-channel, representative of a long term signal to noise ratio on said respective BF sub-channels, the independent error correcting codes generating at least one component of the binary input vector and a channel polarization applied to the binary input vector by the polarization module, to obtain a binary polarized vector, the method comprising:

obtaining a tuple of data including a value of the long term SNR parameter and a probability distribution set, the probability distribution set including, for each BF sub-channel, data representative of a probability density function distribution of the probability distribution of the first random fading variable corresponding to said sub-channel; and, determining an optimized transmission rate for system throughput based on the long term SNR of said error correcting code system by obtaining a set of design rates leading to an average transmission rate, the set of design rates includes, for each error correcting code, a design rate associated with the combination of parameter values included in the obtained tuple of data, approximating an outage probability representing the probability that an instantaneous channel capacity of at least one polarized BF sub-channel is below the obtained design rate of the error correcting code based on the assumption that each component of the binary input vector is transmitted on a polarized BF sub-channel of an equivalent channel created by the polarization module, and obtaining a kernel associated with the long term SNR parameter value included in the obtained tuple of data and minimizing a function of the approximated outage probability for the average transmission rate, generating binary polarized vectors using the determined optimized transmission rate and providing the binary polarized vectors to the modulation module, and modulating the generated binary polarized vectors and transmitting the modulated binary polarized vectors, wherein said optimized transmission rate is the sum of the design rates.

2. A method according to claim 1 wherein, the polarization module is adapted to implement any polarization kernel of a predefined set of polarization kernels, and wherein, one feature of the error correcting code system determined is a polarization kernel selected in the predefined set of polarization kernels.

3. A method according to claim 2 wherein, each polarization kernel of the predefined set of polarization kernels is a square matrix made of coefficients equal to "0" or "1", said matrix being of full rank and comprises at least one row comprising two coefficients equal to "1".

4. A method according to claim 1 wherein, when determining the features of said error correcting code system, a plurality of transmission rates are tested, and the transmission rate maximizing a function of the outage probability representative of the throughput of the error correcting code system is selected.

5. A method according to claim 1 wherein, the instantaneous channel capacity of a polarized BF sub-channel is computed as a mutual information between a current component intended to be transmitted on said polarized sub-channel and an output vector resulting from the transmission of the binary polarized vector on the BF sub-channels, where each component of the binary input vector with which the current component interferes after channel polarization by the polarization module and a set of first random variables comprising the first random variables of each BF sub-channel are known; and, the features minimizing the outage probability are determined using a statistical method comprising:

evaluating an instantaneous channel capacity for each polarized BF sub-channel, for each set of first random fading variables of a plurality of possible sets of first random fading variables and for each polarization kernel of the predefined set of polarization kernels; and, for each value of the long term SNR parameter comprised in a pre-defined set of values of the long term SNR parameter, for each probability distribution set of a pre-defined plurality of probability distribution sets and for each transmission rate of a pre-defined set of transmission rates using the evaluated instantaneous channel capacities to determine the features of said error correcting code system minimizing the approximated outage probability for said value of the long term SNR parameter, said probability distribution set and said transmission rate.

6. A method according to claim 5 wherein the instantaneous channel capacity of each polarized BF sub-channel is evaluated for one set of first random fading variables of the plurality of possible sets of first random fading variables and one polarization kernel of the predefined set of polarization kernels by using a process based on a Monte-Carlo simulation and a belief propagation decoding on said one polarization kernel with a genie-aided method that assumes perfect a priori input for the components of the binary input vector with which the component intended to be transmitted on said sub-channel interferes after channel polarization by the polarization module, said process comprising for each polarized BF sub-channel:

iteratively generating a random Log Likelihood Ratio L following a Gaussian distribution and performing a belief propagation decoding of said random Log Likelihood Ratio L on said polarization kernel and computing a value representative of an estimation J' of the instantaneous channel capacity of said polarized BF sub-channel using a result L' of the belief propagation decoding of the random Log Likelihood Ratio L as follows:

$$J'=1-\log_2(1+\exp(-L'));$$

and, evaluating the instantaneous channel capacity of said polarized BF sub-channel as an average of the estimations J' of the instantaneous channel capacity of said polarized BF sub-channel.

7. A method according to claim 5 wherein when determining the features of said error correcting code system minimizing the approximated outage probability for each value of the long term SNR parameters included in the pre-defined set of values of the long term SNR parameter, for each probability distribution set of the pre-defined plurality of probability distribution sets and for each transmission rate of the pre-defined set of transmission rates, an approximated outage probability is computed for each polarization kernel of the predefined set of polarization kernels and for each set of design rates of a plurality of sets of design rates, each set of design rates of said plurality of sets of design rates comprising a design rate for each error correcting code.

8. A method according to claim 7 wherein each approximated outage probability is obtained for a value of the long term SNR parameter, for a probability distribution set and for a design rate by a numerical integration of a product of probability density functions of the first random fading variables on a region such that the instantaneous channel capacity of at least one polarized BF sub-channel is below the design rate of the error correcting code providing the component of the binary input vector intended to be transmitted on said polarized BF sub-channel, the probability density functions of the first random fading variable being determined using said value of the long term SNR parameter and said probability distribution set.

9. A method according to claim 7 wherein the approximated outage probability is obtained by a Monte-Carlo simulation that generates random realizations of the first random fading variables and accumulates an error event if the instantaneous channel capacity of at least one polarized BF sub-channel is below the design rate of the error correcting code providing the component of the binary input vector intended to be transmitted on said polarized BF sub-channel.

10. A method according to claim 5, wherein the statistical method is implemented offline and allows obtaining a correspondence table including, for each value of the long term SNR parameter comprised in the pre-defined set of values of the long term SNR parameter and for each probability distribution set of the pre-defined plurality of probability distribution sets the features of the error correcting code system adapted to said value of the long term SNR parameter and said probability distribution set and minimizing the outage probability, the features of the error correcting code system adapted to the obtained tuple of data and minimizing the outage probability being determined by using said correspondence table.

11. A device for determining a transmission rate of an error correcting code system which improves throughput, comprising independent error correcting codes and transmitting a binary input vector on block fading (BF) sub-channels, each BF sub-channel being affected by an Additive White Gaussian Noise with a signal to noise ratio independently represented on each BF sub-channel by a corresponding first random fading variable, and a probability density function representative of a probability distribution of the first random fading variable representative of a fading on a respective BF sub-channel, and a long term SNR parameter, identical on each BF sub-channel, representative of a long term signal to noise ratio on said respective BF sub-channels, the independent error correcting codes generating at least one component of the binary input vector and a channel polarization applied to the binary input vector to obtain a binary polarized vector, the device comprising:
  a polarization module that applied the channel polarization to the binary input vector;
  a modulation module that transmits the binary input vector on the BF sub-channels; and
  a processing module configured to
    obtain a tuple of data including a value of the long term SNR parameter and a probability distribution set, the probability distribution set including, for each BF sub-channel, data representative of a probability density function distribution of the probability distribution of the first random fading variable corresponding to a corresponding BF sub-channel;
    determine an optimized transmission rate for system throughput based on the long term SNR of said error correcting code system by
      obtaining a set of design rates leading to an average transmission rate, the set of design rates includes, for each error correcting code, a design rate associated with the combination of parameter values included in the obtained tuple of data,
      approximating an outage probability representing the probability that an instantaneous channel capacity of at least one polarized BF sub-channel is below the obtained design rate of the error correcting code based on the assumption that each component of the binary input vector is transmitted on a polarized BF sub-channel of an equivalent channel created by the polarization module, and
      obtaining a kernel associated with the long term SNR parameter value included in the obtained tuple of data and minimizing the approximated outage probability for the average transmission rate,
    generating binary polarized vectors using the determined optimized transmission rate and providing the binary polarized vectors to the modulation module, and
    providing the generated polarized vectors to the modulation module and transmitting the modulated binary polarized vectors, wherein
    said optimized transmission rate is the sum of the design rates.

12. A transmission system comprising an error correcting code system allowing transmitting a binary input vector on (BF) block fading sub-channels, each BF sub-channel being affected by an Additive White Gaussian Noise with a signal to noise ratio independently represented on each BF sub-channel by a corresponding first random fading variable, and a probability density function representative of a probability distribution of the first random fading variable representative of a fading on a respective BF sub-channel, and a long term SNR parameter, identical on each BF sub-channel, representative of a long term signal to noise ratio on said respective BF sub-channels, the error correcting code system comprising independent error correcting codes, each adapted to generate at least one component of the binary input vector, and a polarization module, adapted to apply a channel polarization to the binary input vector to obtain a binary polarized vector, the transmission system comprising a device according to claim 11.

13. A receiver system comprising an inverse error correcting code system adapted to decode an output vector resulting from a transmission, by a transmission system, of a binary polarized vector on block fading (BF) sub-channels, each BF sub-channel being affected by an Additive White Gaussian Noise with a signal to noise ratio independently represented on each BF sub-channel by a corresponding first random fading variable and a probability density function representative of a probability distribution of the first random fading variable representative of a fading on a respective BF sub-channel, and a long term SNR parameter, identical on each BF sub-channel, representative of a long term signal to noise ratio on said respective BF sub-channels, the binary polarized vector having been generated by an error correcting code system comprised in the transmission system comprising independent error correcting codes each adapted to generate at least one component of a binary input vector and, a polarization module adapted to apply a channel polarization to the binary input vector to obtain the binary polarized vector, the receiver system comprising:
  a device according to claim 11 determining features of the error correcting code system, and
  means for transmitting the determined features to the transmission system.

14. Information storage means storing a computer program comprising program code instructions which can be loaded in a non-transitory programmable device for implementing the method according to claim 1, when the program code instructions are run by the non-transitory programmable device.

\* \* \* \* \*